(12) United States Patent
Tanaka et al.

(10) Patent No.: US 9,590,651 B2
(45) Date of Patent: Mar. 7, 2017

(54) SUCCESSIVE COMPARISON TYPE ANALOG/DIGITAL CONVERTER, PHYSICAL QUANTITY SENSOR, ELECTRONIC DEVICE, MOVING OBJECT, AND SUCCESSIVE COMPARISON TYPE ANALOG/DIGITAL CONVERSION METHOD

(71) Applicant: Seiko Epson Corporation, Tokyo (JP)

(72) Inventors: Atsushi Tanaka, Tatsuno (JP); Hideo Haneda, Matsumoto (JP)

(73) Assignee: Seiko Epson Corporation (JP)

( * ) Notice: Subject to any disclaimer, the term of this patent is extended or adjusted under 35 U.S.C. 154(b) by 156 days.

(21) Appl. No.: 14/666,778

(22) Filed: Mar. 24, 2015

(65) Prior Publication Data

US 2015/0280730 A1  Oct. 1, 2015

(30) Foreign Application Priority Data

Mar. 25, 2014  (JP) ................................ 2014-062507

(51) Int. Cl.
| | |
|---|---|
| *H03M 1/12* | (2006.01) |
| *H03M 1/46* | (2006.01) |
| *H03M 1/06* | (2006.01) |
| *G01P 15/125* | (2006.01) |

(52) U.S. Cl.
CPC ........... *H03M 1/468* (2013.01); *H03M 1/066* (2013.01); *G01P 15/125* (2013.01)

(58) Field of Classification Search
CPC ........ H03M 1/462; H03M 7/30; H03M 1/002; H03M 1/08; H03M 1/1047; H03M 1/468; H03M 1/804

USPC ......................... 341/118, 120, 150, 155, 172
See application file for complete search history.

(56) References Cited

U.S. PATENT DOCUMENTS

| | | | |
|---|---|---|---|
| 6,181,269 B1 | 1/2001 | Nishiuchi et al. | |
| 6,924,760 B1* | 8/2005 | McLeod | H03M 1/066 341/144 |
| 9,077,361 B1* | 7/2015 | Drago | H03M 1/462 |
| 2007/0139243 A1* | 6/2007 | Chowdhury | H03M 1/462 341/155 |
| 2009/0027251 A1* | 1/2009 | Ohnhauser | H03M 1/129 341/158 |
| 2010/0151900 A1* | 6/2010 | Koli | G11C 27/024 455/550.1 |

(Continued)

FOREIGN PATENT DOCUMENTS

| | | |
|---|---|---|
| JP | 07-321656 A | 12/1995 |
| JP | 09-214344 A | 8/1997 |

(Continued)

*Primary Examiner* — Linh Nguyen
(74) *Attorney, Agent, or Firm* — Harness, Dickey & Pierce, P.L.C.

(57) ABSTRACT

A successive approximation type AD converter includes a charge redistribution type DA conversion circuit, a comparator, and a control circuit. The charge redistribution type DA conversion circuit is configured such that each of k unit elements connects a switch and a unit capacitance in series and includes a unit capacitor array that is connected to a common output line in parallel and a selector that selects one voltage supplied to one input terminal, through m voltage supply lines, among at least three input terminals of switches included in j unit elements which are the targets for dynamic element matching (DEM) in k unit elements based on the DEM.

20 Claims, 14 Drawing Sheets

(56) References Cited

U.S. PATENT DOCUMENTS

| | | | |
|---|---|---|---|
| 2011/0102223 A1* | 5/2011 | Kinyua | H03F 3/217 341/143 |
| 2012/0212357 A1* | 8/2012 | Haneda | H03M 1/066 341/110 |
| 2013/0088375 A1* | 4/2013 | Wu | H03M 1/1047 341/120 |

FOREIGN PATENT DOCUMENTS

| | | |
|---|---|---|
| JP | 10-070463 A | 3/1998 |
| JP | 10-075176 A | 3/1998 |
| JP | 2000-059220 A | 2/2000 |
| JP | 2005-218044 A | 8/2005 |
| JP | 2012-175440 A | 9/2012 |

* cited by examiner

| SW1_* | | |
|---|---|---|
| OUT | DEM[3i+j] | DEM_SUB[i] |
| GND | 0 | X |
| Vref | 1 | 0 |
| Nodej | 1 | 1 | i=1~8, j=1~3

| SW2_1 | |
|---|---|
| OUT | LSB[1] |
| GND | 0 |
| Vref/64 | 1 |

| SW2_2 | |
|---|---|
| OUT | LSB[2] |
| GND | 0 |
| Vref/32 | 1 |

| SW2_3 | |
|---|---|
| OUT | LSB[3] |
| GND | 0 |
| Vref/16 | 1 |

FIG. 5

SEL_P

| NODEPn | XSH_CLK | RES_CLK | DEM_SELn |
|---|---|---|---|
| PIN | 1 | 0 | 000 |
| VCM | 0 | 1 | 000 |
| VN5 | 0 | 0 | 100 |
| VN4 | 0 | 0 | 010 |
| VN3 | 0 | 0 | 001 | n=0~2

SEL_N

| NODEPn | XSH_CLK | RES_CLK | DEM_SELn |
|---|---|---|---|
| NIN | 1 | 0 | 000 |
| VCM | 0 | 1 | 000 |
| VP5 | 0 | 0 | 100 |
| VP4 | 0 | 0 | 010 |
| VP3 | 0 | 0 | 001 | n=0~2

SW1P

| OUT | DEM[3i+j] | DEM_SUB[i] |
|---|---|---|
| GND | 0 | x |
| VDD | 1 | 0 |
| NODEPj | 1 | 1 | i=0~7, j=0~2

SW1N

| OUT | DEM[3i+j] | DEM_SUB[i] |
|---|---|---|
| VDD | 0 | x |
| GND | 1 | 0 |
| NODENj | 1 | 1 | i=0~7, j=0~2

SW2P

| OUT | LSB[k] |
|---|---|
| GND | 0 |
| VNk | 1 | k=0~2

SW2N

| OUT | LSB[k] |
|---|---|
| VDD | 0 |
| VPk | 1 | k=0~2

FIG. 9

SUCCESSIVE COMPARISON TYPE ANALOG/DIGITAL CONVERTER, PHYSICAL QUANTITY SENSOR, ELECTRONIC DEVICE, MOVING OBJECT, AND SUCCESSIVE COMPARISON TYPE ANALOG/DIGITAL CONVERSION METHOD

BACKGROUND

1. Technical Field

The present invention relates to a successive approximation type analog/digital converter, a physical quantity detecting sensor, an electronic device, a moving object, and a successive approximation type analog/digital conversion method.

2. Related Art

For example, a physical quantity detecting sensor such as an acceleration sensor changes an analog signal which is a measured physical quantity to a digital signal using an analog/digital (AD) converter and outputs the digital signal. As a successive approximation type AD converter that increases the bits while keeping the small area as it is, a combination of a charge redistribution type digital/analog (DA) conversion circuit and a resistance voltage-dividing type DA conversion circuit is known. In a charge redistribution type DA converter, the capacitance is weighted in a binary ratio of "1:2:4:8:16:32." In this manner, the conversion accuracy between the high-order bits using a charge redistribution type DA conversion circuit and the low-order bits using a resistance voltage-dividing type DA conversion circuit is degraded because of the ratio accuracy of the capacitance.

A circuit which is configured of the same unit capacitance without weighting the capacitance of a charge redistribution type DA conversion circuit and connects an output voltage of a resistance voltage-dividing type DA conversion circuit to each unit capacitance is suggested (JP-A-9-214344).

Meanwhile, a circuit in which dynamic element matching (DEM) is applied to a charge redistribution type DA conversion circuit whose capacitance is weighted in a binary ratio is suggested (JP-A-2012-175440). According to JP-A-2012-175440, since it becomes possible to provide randomness for a combination pattern of the capacitance in a capacitance array, the apparent capacitance ratio accuracy in the capacitance array can be improved.

In regard to the invention disclosed in JP-A-9-214344, improvement in the conversion accuracy between the high-order bits using a charge redistribution type DA conversion circuit and the low-order bits using a resistance voltage-dividing type DA conversion circuit is made, but the influence of the ratio accuracy of the unit capacitance in the charge redistribution type DA conversion circuit is unlikely to be improved. The main reason for the occurrence of this problem is that the unit capacitance with required ratio accuracy is hardly produced. The ratio accuracy is improved when the unit capacitance is increased, but new problems of an increase in input capacitance or an increase in circuit area are generated.

In regard to the invention disclosed in JP-A-2012-175440, a converter configured of a charge redistribution type DA conversion circuit is used. Accordingly, there is a problem in that the capacitance ratio of an AD converter becomes larger than that of the combination of a charge redistribution type DA conversion circuit and a resistance voltage-dividing type DA conversion circuit when an AD converter with the same resolution is configured and thus the circuit area is increased.

SUMMARY

An advantage of some aspects of the invention is to provide a successive approximation type AD converter, a physical quantity detecting sensor, an electronic device, a moving object, and a successive approximation type AD conversion method capable of reducing influence of the ratio accuracy of the unit capacitance even when the unit capacitance is decreased.

The invention can be implemented as the following forms or application examples.

(1) An aspect of the invention relates to a successive approximation type AD converter including: a charge redistribution type DA conversion circuit; a comparator that compares an output voltage with a reference voltage of the charge redistribution type DA conversion circuit; and a control circuit that controls the charge redistribution type DA conversion circuit based on the comparison results of the comparator, in which the charge redistribution type DA conversion circuit includes: a unit capacitor array in which respective k (k is an integer of 4 or greater) unit elements are configured by connecting a switches and a unit capacitance in series and the k unit elements connected to a common output line in parallel are two-dimensionally arranged; and a selector that selects one voltage supplied to one input terminal, through m (m is an integer of 2 to smaller than j) voltage supply lines, among at least three input terminals of the switch having j (j is an integer of 4 to k) unit elements that are the targets for dynamic element matching (DEM) in the k unit elements based on the DEM, the control circuit controls the selector and respective switches of the k unit elements based on the comparison results of the comparator, the selector selects an analog voltage to be converted which is to be supplied to the m voltage supply lines in common during a first period for which an analog voltage is sampled and held in the unit capacitor array, and the selector selects m weighted reference voltage as a voltage to be supplied to the m voltage supply lines during the second period for which the comparison is successively performed subsequent to the first period.

According to the aspect of the invention, the influence of the ratio accuracy of the unit capacitance can be reduced even when the unit capacitance is decreased in order to reduce the input capacitance and the circuit area. This is because a DEM technique is applied to (j−m) unit capacitances to have a capacitance ratio by connecting the unit capacitances in parallel and m unit capacitances that do not have a capacitance ratio by allowing the reference voltage to be connected to have a ratio (weighting). In addition, the number k of the unit elements is determined by the resolution intended to be configured and the number j of the unit elements which are the targets for DEM in the unit elements are determined by the required ratio accuracy.

(2) In the aspect of the invention, the weighted reference voltage may be generated by resistance voltage-dividing a reference voltage in a resistance voltage-dividing type DA conversion circuit.

Since the weighted reference voltage is ½, ¼, or ⅛ of a reference voltage Vref, the weighted reference voltage can be easily generated by voltage-dividing the reference voltage by the resistance. Further, the resistance ratio can be decreased when the resistance voltage division of a resistance voltage-dividing type DA conversion circuit having an R-2R ladder type or the like is used and thus miniaturization becomes possible.

(3) In the aspect of the invention, the control circuit may switch the switch such that one input terminal is electrically conducted with the unit capacitance during the first period, switch the switch such that either of one of m weighted reference voltages and a ground voltage is supplied to the m unit elements during the second period, and switch the switch such that one of the reference voltage and the ground voltage to be supplied to other input terminals other than the one input terminal of the switch is supplied to the remaining (j−m) unit elements.

In this manner, the analog voltage which is a target to be converted is supplied to a unit element through one of at least three input terminals during the first period and the analog voltage can be sampled and held in the unit capacitor array. Further, during the second period, a DEM technique can be applied to both of (j−m) unit capacitances to have a capacitance ratio by connecting the unit capacitances in parallel and m unit capacitances that do not have a capacitance ratio by allowing the reference voltage to be connected to have a ratio (weighting).

(4) In the aspect of the invention, the j unit elements are arranged in M rows×N columns (N is an integer of two or greater and M is an integer of m or greater), one of the m voltage supply lines, a supply line of the reference voltage, and a supply line of the ground voltage may be extended for each of M rows along a row direction in the matrix of M rows×N columns, and at least one control signal line that specifies the m unit elements and m control signal lines that select one input terminal from among at least three input terminals may be extended from each of N columns along a column direction in the matrix of M rows×N columns.

In this manner, it is possible to facilitate wiring of a control single line or a voltage to be connected to j unit elements which are the targets for DEM arranged in M rows×N columns.

(5) In the aspect of the invention, N may be greater than M. It is possible to decrease the number of control signal lines specifying m unit elements by making the number of rows M smaller that the number of columns N. Further, the number (j−m) of the unit capacitance to have a capacitance ratio by connecting the unit capacitances in parallel is greater than the number m of unit capacitances that do not have a capacitance ratio by allowing the reference voltage to be connected to have a ratio (weighting). Accordingly, since it is not necessary for M to be large more than necessary as long as M is greater than or equal to m, N becomes easily greater than M.

(6) In the aspect of the invention, M may be equal to m. In this manner, the number of control signal lines specifying m unit elements is sufficient to be one.

(7) In the aspect of the invention, j may be smaller than k and (k−j) unit elements that are not the targets for DEM may be arranged adjacently to an endmost column in the matrix of M rows×N columns, and one of the m weighted reference voltages may be input to one input terminal of the switches respectively included in the (k−j) unit elements and the ground voltage may be input to another input terminal thereof.

In this manner, wiring that supplies a voltage to (k−j) unit elements other than the targets for DEM becomes extremely easy.

(8) In the aspect of the invention, the successive approximation type AD converter may further include a reset switch that supplies a common voltage to the common output line, and the selector may select the common voltage at the time of resetting the unit capacitance and the common voltage may be supplied to both ends of the unit capacitance.

In this manner, DA conversion with higher accuracy becomes possible by resetting residual charge of the unit capacitance.

(9) In the aspect of the invention, the capacitance array may include a first capacitance array in which the k unit elements are connected to a first common output line in series and a second capacitance array in which the k unit elements are connected to a second common output line in parallel, and the selector may include a first selector to which the analog voltage is input from one of two differential signal lines and which is connected to the first capacitance array and a second selector to which the analog voltage is input from the other differential signal line and which is connected to the second capacitance array, and the comparator may compare an output from the first common output line with an output from the second common output line.

In this manner, the differential signal can set to be the target for AD conversion and the application of the successive distribution type AD conversion circuit can be widened.

(10) Another aspect of the invention relates to a physical quantity detecting sensor including: a physical quantity detecting sensor element; and an IC that is connected with the physical quantity detecting sensor element described above and includes the successive approximation type AD converter described above.

According to the another aspect of the invention, a sensor which is small and has high accuracy can be realized.

(11) Still another aspect of the invention relates to an electronic device including the physical quantity detecting sensor described above.

(12) Still another aspect of the invention relates to a moving object including the physical quantity detecting sensor described above.

(13) Still another aspect of the invention relates to a successive approximation type AD conversion method including: specifying m (m is an integer of 2 to smaller than j) unit elements, by dynamic element matching (DEM), among j (j is an integer of 4 to k) unit elements that are targets for the DEM from among k (k is an integer of 4 or greater) unit elements which are provided in a charge redistribution type DA conversion circuit and respectively configured by connecting a switch and a unit capacitance in series, supplying a weighted reference voltage obtained by resistance voltage-dividing a reference voltage in a resistance voltage-dividing type DA conversion circuit to the m unit elements through one input terminal among at least three input terminals of the switches respectively provided for the m unit elements, and supplying one of the reference voltage and a ground voltage supplied to other input terminals other than the one input terminal to the (j−m) unit elements through the switch included in the remaining (j−m) unit elements.

In the still another aspect of the invention, an effect of reducing the influence of the ratio accuracy of the unit capacitance can be obtained even when the unit capacitance is decreased in order to reduce the input capacitance and the circuit area.

(14) In the still another aspect of the invention, the weighted reference voltage may be generated by resistance voltage-dividing a reference voltage in a resistance voltage-dividing type DA conversion circuit.

Since the weighted reference voltage is ½, ¼, or ⅛ of a reference voltage Vref, the weighted reference voltage can be easily generated by voltage-dividing the reference voltage by the resistance. Further, the resistance ratio can be decreased when the resistance voltage division of a resistance voltage-dividing type DA conversion circuit having an R-2R ladder type or the like is used and thus miniaturization becomes possible.

(15) In the still another aspect of the invention, the m unit elements may be specified from among the j unit elements arranged in M rows×N columns (N is an integer of 2 or greater and M is an integer of m) in a column unit by the DEM. In this manner, the m unit elements can be specified from among the j unit elements in a column unit by the DEM only by providing one control line for each column.

(16) In the still another aspect of the invention, a pointer may be set to one of the j unit elements arranged in M rows×N columns, and the m unit elements may be specified in a column unit by the DEM based on the position of the pointer.

When a pointer is used, identification of the m unit elements to be specified next time in a column unit is easily controlled and the randomness can be improved.

BRIEF DESCRIPTION OF THE DRAWINGS

The invention will be described with reference to the accompanying drawings, wherein like numbers reference like elements.

FIG. 5 is a diagram illustrating a relationship between a voltage that is output through a switch connected to a unit capacitance and a control signal that switches the switch.

FIG. 9 is a diagram illustrating a relationship between a control signal and an operation state of a switch and a selector of the successive approximation type AD conversion circuit illustrated in FIG. 8.

DESCRIPTION OF EXEMPLARY EMBODIMENTS

Hereinafter, an embodiment of the invention will be described with reference to the accompanying drawings. Further, the present embodiment described below is not intended to limit the contents of the invention described in the aspects of the invention, and all configurations described in the present embodiment are not necessarily indispensable as means for solving the invention.

1. Successive Approximation Type AD Conversion Circuit

Figure 1:
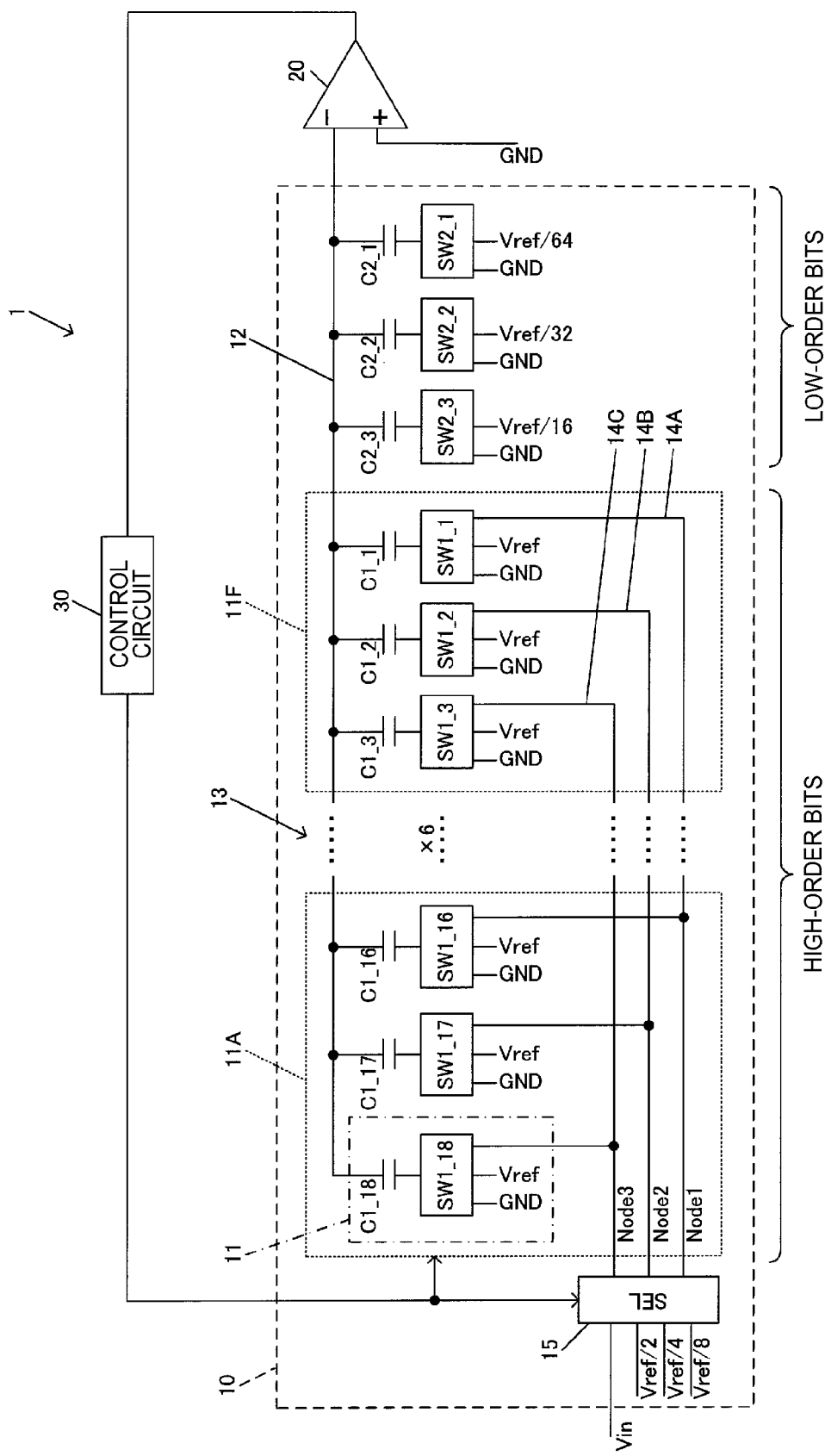
FIG. 1 is a circuit diagram illustrating a successive distribution type AD conversion circuit that includes a charge redistribution type DA conversion circuit according to an embodiment of the invention.
Figure 2:
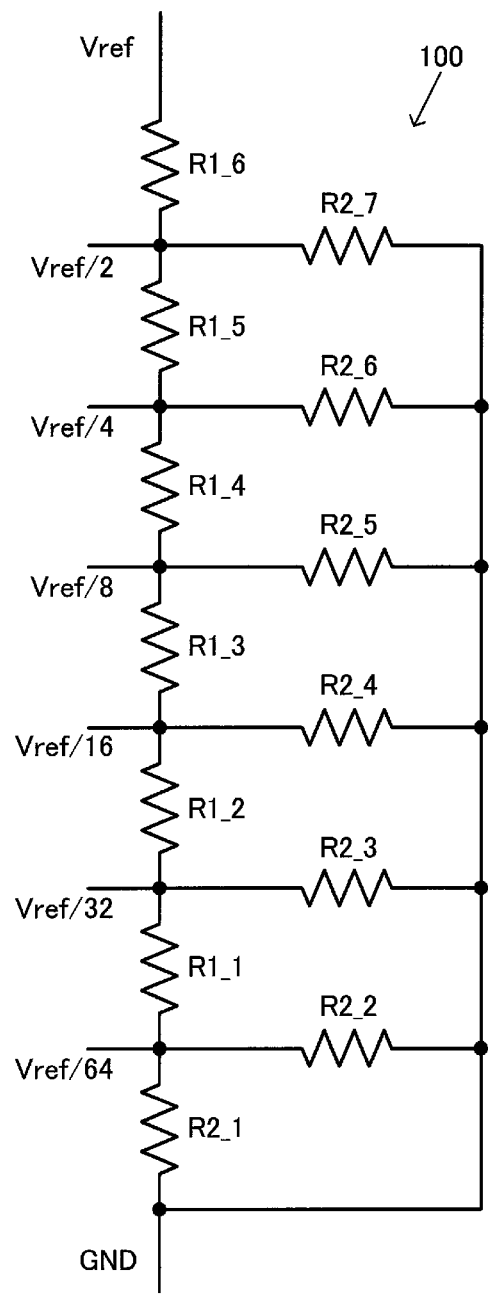
FIG. 2 is a circuit diagram illustrating a resistance voltage-dividing type DA conversion circuit in a successive distribution type AD conversion circuit according to an embodiment of the invention.
Figure 3:
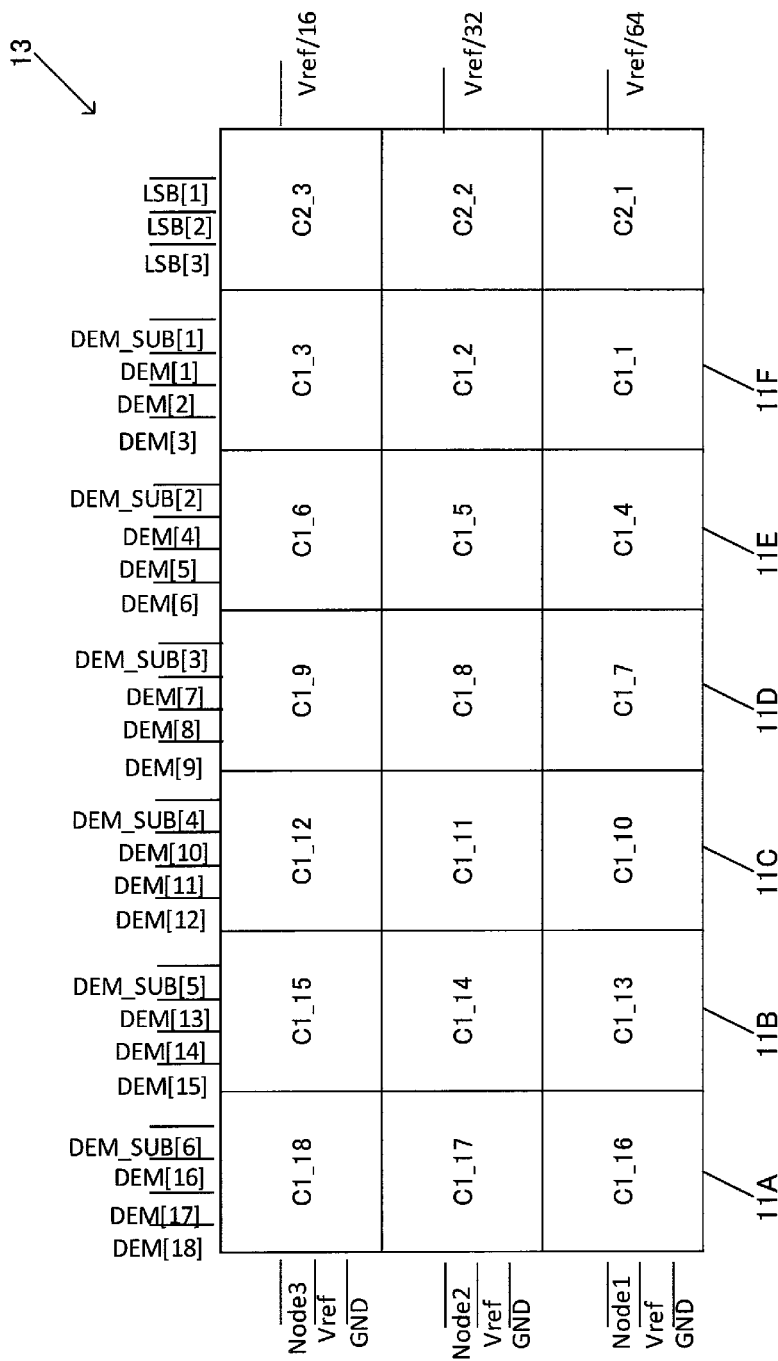
FIG. 3 is a layout diagram of a unit capacitor array included in the charge redistribution type DA conversion circuit illustrated in FIG. 1.

A 10-bit successive approximation type AD conversion circuit 1 illustrated in FIG. 1 includes a charge redistribution type digital/analog (DA) conversion circuit 10 illustrated in FIG. 1 and a resistance voltage-dividing type DA conversion circuit 100 having an R-2R type illustrated in FIG. 2. FIG. 3 illustrates a planar layout of a unit capacitor array 13 of the charge redistribution type DA conversion circuit 10 illustrated in FIG. 1.

The 10-bit successive approximation type AD conversion circuit 1 illustrated in FIG. 1 includes a charge redistribution type DA conversion circuit 10, the resistance voltage-dividing type DA conversion circuit 100 that supplies a weighted reference voltage to the charge redistribution type DA conversion circuit 10 by resistance voltage-dividing a reference voltage Vref as illustrated in FIG. 2, a comparator 20 that successively compares an output of the charge redistribution type DA conversion circuit 10 with a reference voltage (for example, GND), and a control circuit 30 that controls the charge redistribution type DA conversion circuit 10 based on the comparison results of the comparator 20.

The control circuit 30 controls the charge redistribution type DA conversion circuit 10 (a selector 15 described below and respective switches SW of k unit elements 11) based on the comparison results of the comparator 20. The control circuit 30 further includes a comparison approximation resister SAR (Successive Approximation Register) (not illustrated) whose resister value is set according to the comparison results from the comparator 20 and an output code is confirmed and stored from the most significant bit (MSB) according to an output of the comparator 20.

As illustrated in FIG. 2, the resistance voltage-dividing type DA conversion circuit 100 performs resistance voltage-dividing the reference voltage Vref using an R-2R type voltage-dividing circuit and six weighted reference voltages Vref/2, Vref/4, Vref/8, Vref/16, Vref/32, and Vref/64 in total which are weighted in a binary ratio are generated. The reference voltage Vref and the six weighted reference voltages which are outputs of the resistance voltage-dividing type DA conversion circuit 100 of FIG. 1 are supplied to the charge redistribution type DA conversion circuit 10 illustrated in FIG. 1.

The charge redistribution type DA conversion circuit 10 includes a unit capacitor array 13 in which respective k (k is an integer of 4 or greater and k is 21 in the present embodiment) unit elements 11 are configured by connecting a switch SW and a unit capacitance C in series and the k unit elements 11 connected to a common output line 12 in parallel are two-dimensionally arranged. Here, in FIG. 1, the unit capacitances C in the case where k is 21 is noted as unit capacitances C1_18 to C1_1 to be allocated to the high-order 7 bits and unit capacitances C2_3 to C2_1 to be allocated to the low-order 3 bits. The unit capacitances C1_18 to C1_1 and the unit capacitances C2_3 to C2_1 include unit capacitance values (1C) which are all equivalent to one another. Similarly, in FIG. 1, the switches SW in the case where k is 21 are noted as switches SW1_18 to SW1_1 to be connected to each one of unit capacitances C1_18 to C1_1 allocated to the high-order 7 bits and switches SW2_3 to SW2_1 to be connected to each one of unit capacitances C2_3 to C2_1 allocated to the low-order 3 bits.

The charge redistribution type DA conversion circuit 10 includes a selector 15 which selects any one of an analog voltage Vin which is a target for conversion, the reference voltage Vref/2, Vref/4, and Vref/8. The selector 15 selects the analog voltage Vin which is the target for conversion to be supplied to m (m is an integer of 2 to smaller than j and m is 3 in the present embodiment) voltage supply lines 14A, 14B, and 14C in common during a first period for which the analog voltage which is the target for conversion is sampled and held in the unit capacitor array 13.

The selector 15 selects one voltage supplied to one input terminal among three input terminals of the switch SW included in j (j is an integer of 4 to k and j is 18 in the present embodiment) unit elements which are the targets for dynamic element matching (DEM) in k unit elements through the m voltage supply lines 14A, 14B, 14C during a second period for which the comparison is successively performed subsequent to the first period.

Among the unit elements 11 in the case where k is 21, the number of unit elements 11 which are the targets for dynamic element matching (DEM) can be set as j (j is an integer of 4 to k). In the present embodiment, (j=18) is set to be smaller than (k=21), the unit elements 11 (unit capacitances C1_18 to C1_1 and switches SW1_18 to SW1_1) allocated to the high-order 7 bits are set to be the targets for DEM, and the unit elements 11 (unit capacitances C2_3 to C2_1 and switches SW2_3 to SW2_1) allocated to the low-order 3 bits are not set to be the target for DEM. Further, all the unit elements 11 may be set to be the target for DEM in the case where j is k. In this case, when the unit capacitances which are the targets for DEM are increased, the number m of the voltage supply lines 14A, 14B, and 14C is increased.

The unit elements 11 (unit capacitances C1_18 to C1_1 and switches SW1_18 to SW1_1) allocated to the high-order 7 bits as the targets for DEM are dynamically allocated to any one of the high-order 7 bits using DEM and, for example, the unit elements 11 having the unit capacitance C1_18 and the switch SW1_18 are not constantly and necessarily allocated to the most significant bit MSB. Meanwhile, the unit elements 11 (unit capacitances C2_3 to C2_1 and switches SW2_3 to SW2_1) which are not the targets for DEM are constantly and fixedly allocated to the low-order 3 bits.

Eighteen unit elements 11 (unit capacitances C1_18 to C1_1 and switches SW1_18 to SW1_1) in total which are allocated to the high-order 7 bits as the targets for DEM include six unit element groups 11A to 11F in total by being grouped whenever m which is the number (number of the voltage supply lines 14A, 14B, and 14C) of nodes (nodes 1 to 3) of the selector 15 is 3. Respective three of the unit elements 11 belonging to the unit element groups 11A to 11F are configured that one of the voltage supply lines 14A, 14B, and 14C whose respective three switches are different from one another is connected to one of three input terminals. Respective three of the unit elements 11 belonging to the unit element groups 11A to 11F are configured that the reference voltage Vref and a ground voltage GND are supplied to another two input terminals of respective three of the switches SW. Accordingly, in respective three of the unit elements 11 belonging to the unit element groups 11A to 11F, the weighted reference voltages (any one of Vref/2, Vref/4, and Vref/8) which are supplied from the reference voltage Vref, the ground voltage GND, or the resistance voltage-dividing type DA conversion circuit 100 illustrated in FIG. 2 and then selected by the selector 15 are switched by the switches SW and can be connected to the unit capacitance C.

Meanwhile, in three unit elements 11 (unit capacitances C2_3 to C2_1 and switches SW2_3 to SW2_1) which are not the targets for DEM, the ground voltage GND is supplied to one input terminal of the switches SW, and the weighted reference voltages (any one of Vref/16, Vref/32, and Vref/64) which are different from one another are supplied to other input terminals from the resistance voltage-dividing type DA conversion circuit 100 illustrated in FIG. 2.

The unit elements 11 in the case where k is 21 can be arranged in a matrix as illustrated in FIG. 3 in order to supply respective voltages to the switches SW of the unit elements 11 in the case where k is 21. In the present embodiment, the number j of the unit elements 11 which are the targets of DEM is smaller than the total number k of the unit elements 11 (j<k). The unit elements 11 (unit capacitances C1_18 to C1_1 and the switches SW1_18 to SW1_1) which are the targets of DEM can be two-dimensionally arranged in a matrix of M rows×N columns (N is an integer of 2 or greater and M is an integer of m or greater, M is 3 and N is 6 in the present embodiment).

In the present embodiment, N is set to 6 because the number of N columns is equalized to the number of unit element groups 11A to 11F. M is set to 3 because the number of M rows is equalized to the number of unit capacitances respectively included in the unit element groups 11A to 11F. In this manner, one of the unit element groups 11A to 11F which are the targets for DEM in a column unit can be specified. In addition, in one of the unit element groups 11A to 11F which are the targets of the DEM to be specified in the column unit, voltages connected to the unit capacitances in the case where m is M can be specified in a column unit so as to be the targets for DEM.

The unit elements 11 (unit capacitances C2_3 to C2_1 and switches SW2_3 to SW2_1) which are not the targets for DEM in the case where (k−j) is 3 are arranged adjacent to the unit elements 11 (unit capacitances C1_3 to C1_1 and switches SW1_3 to SW1_1) in the endmost column in a matrix of M rows×N columns (3 rows×6 columns) illustrated in FIG. 3. In this manner, the weighted reference voltages Vref/16, Vref/32, and Vref/64 can be easily supplied to the unit elements 11 (unit capacitances C2_3 to C2_1 and switches SW2_3 to SW2_1) which are not the targets for DEM in the case where (k−j) is 3. As a result, twenty one unit elements 11 in total are arranged in 3 rows×7 columns as illustrated in FIG. 3. The unit capacitances C1_18 to C1_1 and C2_3 to C2_1 are arranged on the upper layer of the unit capacitor arrays 13 arranged in 3 rows×7 columns and the switches SW1_18 to SW1_1 and SW2_3 to SW2_1 paired with the unit capacitances can be arranged on the lower layer of the unit capacitances.

In a region in which eighteen unit elements 11 which are the targets for DEM are arranged in "M=3 rows×N=6 columns," one of the voltage supply lines 14A to 14C in the case where m is 3, a supply line of the reference voltage Vref, and a supply line of the ground voltage GND connected to the nodes Node 1 to 3 of the selector 15 are extended for each row of M rows along the row direction. In addition, one of the control signal lines DEM_SUB[6] to DEM_SUB[1] specifying m unit elements which are the targets for supplying the weighted reference voltage and three control signal lines (one of DEM[18] to DEM[16], DEM[15] to DEM[13], DEM[12] to DEM[10], DEM[9] to DEM[7], DEM[6] to DEM[4], DEM[3] to DEM[1]) selecting one of three input terminals of the switch SW are extended to each column of N column along the column direction in a matrix of M rows×N columns. In the present embodiment, since the number of M rows is set as "M=m," one of the control signal lines (DEM_SUB[6] to DEM_SUB[1]) specifying m unit elements which are the targets for supplying the weighted reference voltage may be provided for each column and the number of the voltage supply lines extended in the column direction becomes minimum. Further, since the number of the control signal lines extended in the column direction becomes larger according to the number of voltage supply lines extended in the row direction, the number of wirings can be reduced by setting M to be smaller than N.

Figure 4:
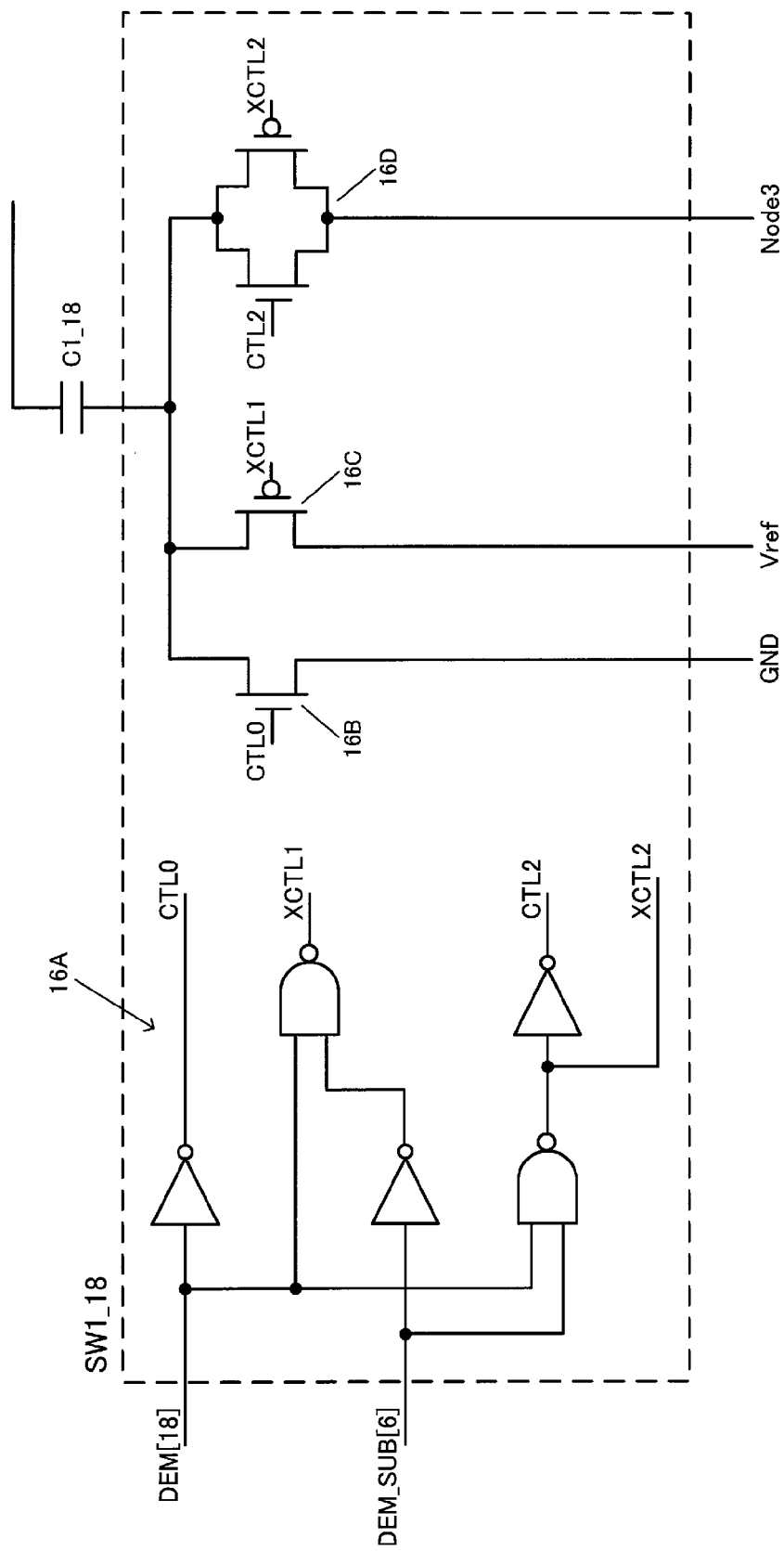
FIG. 4 is a circuit diagram of a switch to be connected to a unit capacitance.

FIG. 4 is a circuit diagram of the unit element 11 which is the target for DEM. FIG. 4 illustrates the unit element 11 having the unit capacitance C1_18 and the switch SW1_18, but other unit elements 11 have the same configurations. The switch SW1_18 to which the control signals DEM_SUB[6] and DEM[18] supplied to the column direction of FIG. 3 are input includes a logic circuit 16A that generates gate signals CTL0, XCTL1, CTL2, and XCTL2. These gate signals CTL0, XCTL1, CTL2, and XCTL2 are supplied to a gate of a transfer gate 16D connected to a MOS transistor 16B connected to the ground voltage GND, a MOS transistor 16C connected to the reference voltage Vref, and a node 3.

2. Operation of Successive Approximation Type AD Conversion Circuit

When 10 bits are configured only by the charge redistribution type DA conversion circuit, the capacitance ratio becomes 512 times in maximum and the circuit area becomes increased. In the present embodiment, the high-order 4 bits have a capacitance ration of 8:4:2:1: due to connection of the unit capacitance values (C1) in parallel, the low-order 6 bits do not have a capacitance ratio, and the reference voltages connected to the switches SW are weighted in a ratio of "½:¼:⅛:1/16:1/32:1/64". The weighted reference voltages are generated by the resistance voltage-dividing DA conversion circuit 100 illustrated in FIG. 2. With this configuration, the capacitance ratio is suppressed to 8 times in maximum and the circuit area can be reduced.

Here, similar to JP-A-9-214344, the ratio accuracy of the unit capacitance values (1C) for each unit element 11 affects the conversion accuracy. Here, the unit elements 11 allocated to output bits are dynamically switched by dynamic element matching (DEM). Apparent ratio accuracy can be improved using DEM not by constantly forming the unit capacitances creating the capacitance ratio with a combination of the same unit capacitances but by forming the unit capacitances with a combination of various unit capacitances. In JP-A-2012-175440, DEM is only applied to a portion which has a capacitance ratio. However, when the unit capacitances are decreased for reducing the circuit area, application of DEM to the high-order 4 bits having a capacitance ratio becomes insufficient and the ratio accuracy of the unit capacitances of the 3 bits affects the conversion accuracy. Here, in the present embodiment, DEM is applied to the unit capacitances which do not have a capacitance ratio and to which the weighted reference voltages Vref/2, Vref/4, and Vref/8 are supplied.

For this reason, the weighted reference voltages Vref/2, Vref/4, and vref/8 are supplied to any one group of the unit element groups 11A to 11F arranged in 6 columns and one group which is different from the group previously selected is selected in each time of conversion operation by the control signal lines DEM_SUB[6] to DEM_SUB[1] illustrated in FIG. 3. Further, a combination of three unit elements 11 in selected one group and the weighted reference voltages Vref/2, Vref/4, and Vref/8 supplied to the unit elements can be dynamically switched by three remaining control signal lines (for example, DEM[18] to DEM[16]) illustrated in FIG. 3. In this manner, DEM can be applied to the unit elements 11 allocated to 3 bits that follow the high-order 4 bits.

Meanwhile, it is possible to dynamically switch whether to supply one of the reference voltage Vref and the ground voltage GND to other five groups of switches SW which are not selected by the control signal lines DEM_SUB[6] to DEM_SUB[1] illustrated in FIG. 3 by the residual three control signal lines (for example, DEM [18] to DEM[16]) illustrated in FIG. 3. In this manner, DEM can be applied to the unit elements 11 allocated to the high-order 4 bits.

FIG. 5 illustrates a relationship between a control signal that is input to an optional switch SW1_* connected to the unit capacitances which are the targets for DEM and a voltage that is switched and output; and a relationship between values of control signals LSB[1] to LSB[3] that are input to switches SW2_1 to SW2_3 connected to the unit capacitances which are not the targets for DEM and a voltage that is switched and output.

Figure 6:
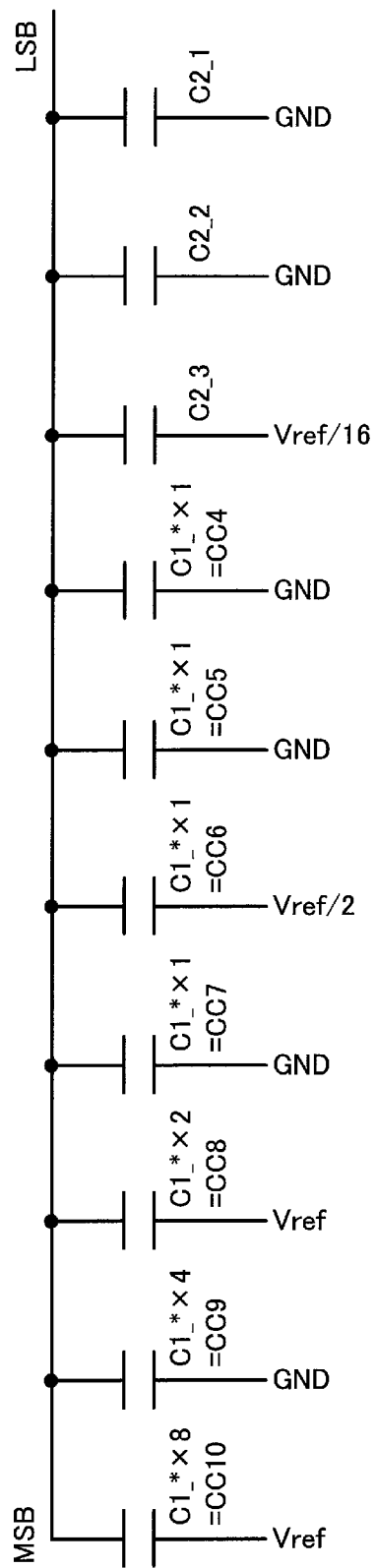
FIG. 6 is an equivalent circuit diagram of a successive distribution type AD conversion circuit at the time when a conversion result of 10 bits becomes 1010100100.

FIG. 6 is an equivalent circuit diagram of the successive distribution type AD conversion circuit 1 at the time when the conversion result of 10 bits is 1010100100. When an optional unit capacitance having a unit capacitance value (C1) is noted as C1_*, a capacitance ratio of "8(C1_*×8): 4(C1_*×4):2(C1_*×2):1(C1_*×1)" is provided for the high-order 4 bits due to the connection of the unit capacitances in parallel. In optional unit capacitances allocated to the high-order 4 bits, the ground voltage GND is supplied in a case of 0 bit and the reference voltage Vref is supplied in a case of 1 bit. In optional unit capacitances allocated to 3 bits that follow the high-order 4 bits, the ground voltage GND is supplied in the case of 0 bit and the corresponding weighted reference voltage (any one of Vref/2, Vref/4, and Vref/8) is supplied in the case of 1 bit. In the unit capacitances C2_3 to C2_1 allocated to the low-order 3 bits, the ground voltage GND is supplied in the case of 0 and the corresponding weighted reference voltage (any one of Vref/16, Vref/32, and Vref/64) is supplied in the case of 1 bit.

Figure 7A:
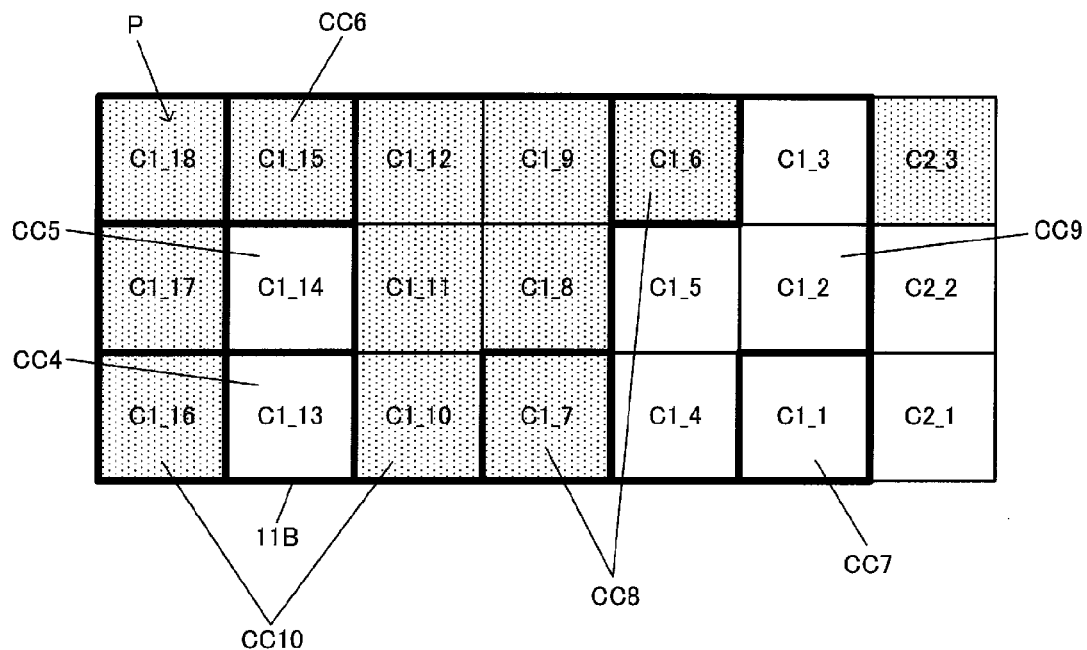
FIGS. 7A and 7B are diagrams describing an operation of allocating dynamic unit capacitances using DEM.

Next, a case where the first conversion result is 1010100100 and the second conversion result is also 1010100100 is assumed. FIG. 7A illustrates the charge redistribution type DA conversion circuit 10 in the case where the conversion result is 1010100100. When the conversion result is 1010100100, eight unit capacitances (C1_18 to C1_16 and C1_12 to C1_8) indicated by CC10 are connected to the reference voltages Vref. Four unit capacitances (C1_5 to C1_2) indicated by CC9 are connected to the ground voltages GND. Two unit capacitances (C1_7 and C1_6) indicated by CC8 are connected to the reference voltages Vref. One unit capacitance (C1_1) indicated by CC7 is connected to the ground voltage GND and one unit capacitance (C1_15) indicated by CC6 is connected to the weighted reference voltage Vref/2. One unit capacitance (C1_14) indicated by CC5 is connected to the ground voltage GND. One unit capacitance (C1_13) indicated by CC4 is connected to the ground voltage GND. The unit capacitance C2_3 is connected to the weighted reference voltage Vref/16. The unit capacitance C2_2 is connected to the ground voltage GND. The unit capacitance C2_1 is connected to the ground voltage GND.

Figure 7B:
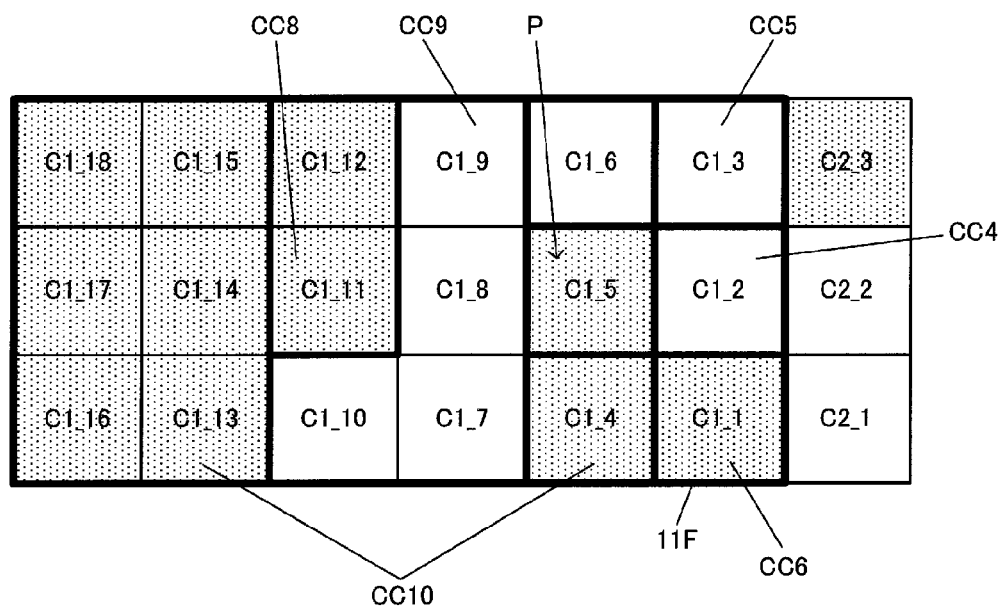

Meanwhile, in the second conversion illustrated in FIG. 7B, CC10 is configured of the unit capacitances C1_5 to C1_4 and C1_18 to C1_13, CC9 is configured of the unit capacitances C1_10 to C1_7, CC8 is configured of the unit capacitances C1_12 to C1_11, CC7 is configured of the unit capacitance C1_6, CC6 is configured of the unit capacitance C1_1, CC5 is configured of the unit capacitance C1_3, and CC4 is configured of the unit capacitance C1_2. In this manner, CC10, CC9, CC8, CC7, CC6, CC5, and CC4 are configured of combinations of the unit capacitances which are different from one another for each conversion using DEM. In this manner, the relative accuracy of the apparent unit capacitances is improved and the conversion accuracy is also improved.

DEM uses a pointer system. A pointer P positioned in the unit capacitance C1_18 in FIG. 7A moves to another unit capacitance C1_5, which is not connected to the reference voltage Vref in the first conversion, in the second conversion as illustrated in FIG. 7B and is connected to the reference voltage Vref from the unit capacitance C1_5. In FIG. 7A, the pointer P is positioned in the unit capacitance C1_18 at the time of the first conversion, connected to the reference voltage from C1_18, and connected to the reference voltage Vref when the pointer P is finally positioned in the unit capacitance C1_6. At the time of the second conversion illustrated in FIG. 7B, since the pointer P is connected to the reference voltage Vref when the pointer P is positioned in the unit capacitance C1_6 at the time of the first conversion, the pointer P moves to the unit capacitance C1_5 and is connected to the reference voltage Vref from the unit capacitance C1_5. A unit element group connected to the weighted reference voltage or the ground voltage at the time of conversion is a unit element group 11B at the time of the first conversion illustrated in FIG. 7A. The unit element group 11B is specified by the control signal DEM-SUB[*] such that the pointer P becomes a column next to the set column. DEM is applied to the unit capacitances C1_15 to C1_13 in the specified unit element group 11B by specifying control of the unit element group and switching control of the selector 15. It is understood that CC6, CC5, and CC4 are configured of unit capacitances which are different between the first conversion and the second conversion from the comparison of FIG. 7A with FIG. 7B.

In this manner, according to the present embodiment, an effect of reducing the influence of the ratio accuracy of the unit capacitance can be obtained even when the unit capacitance is decreased in order to reduce the input capacitance and the circuit area. This is because a DEM technique is applied to both of (j–m) unit capacitances to have a capacitance ratio by connecting the unit capacitances in parallel and m unit capacitances that do not have a capacitance ratio by allowing the reference voltage to be connected to have a ratio (weighting).

Figure 8:
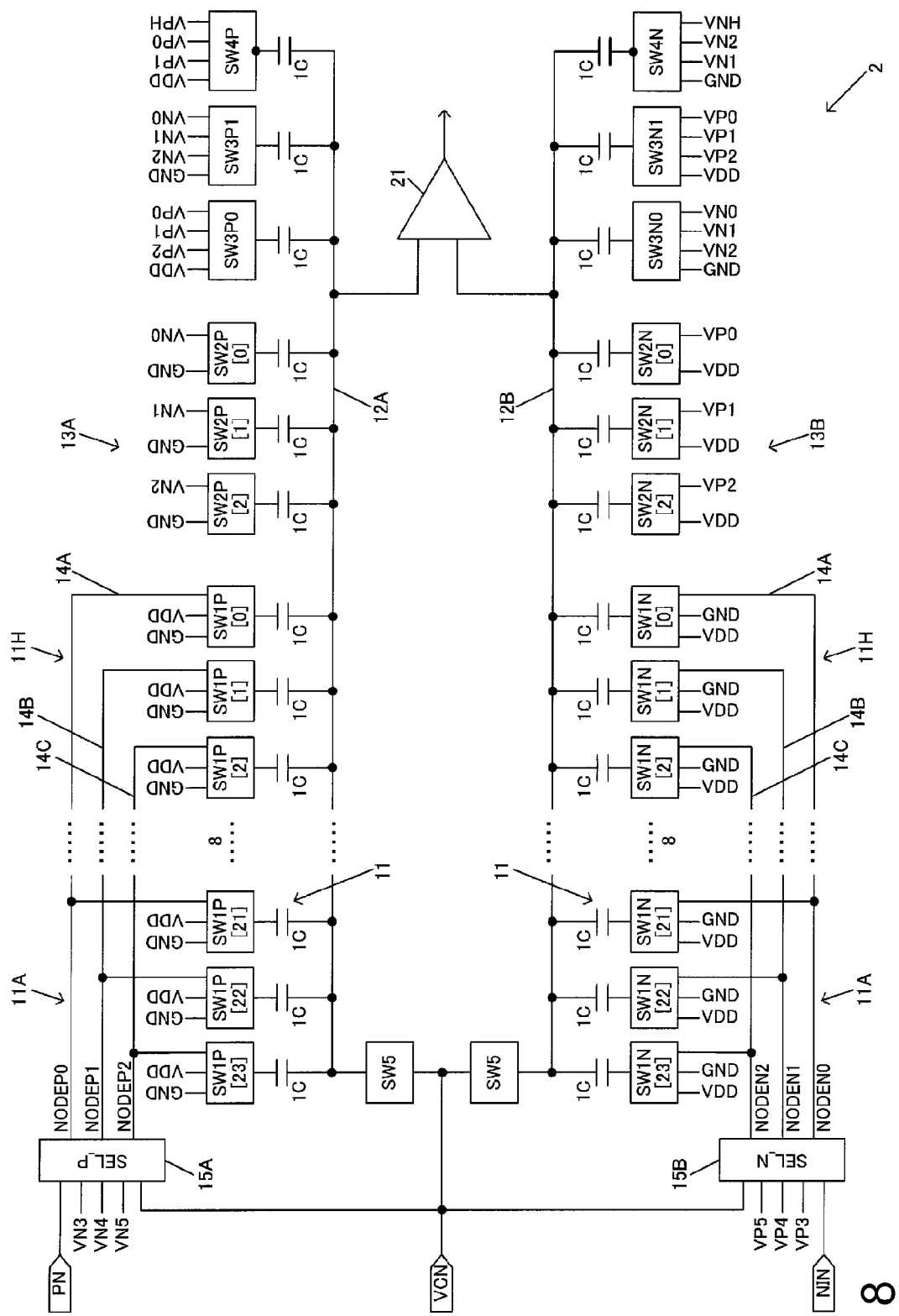
FIG. 8 is a circuit diagram illustrating a successive approximation type AD conversion circuit.

3. Successive Approximation Type AD Conversion Circuit Applied to Differential Signal FIG. 8 is a circuit diagram illustrating a successive approximation type AD conversion circuit 2 applied to differential signals PIN and NIN. Further, in FIG. 8, a member having the same function as the member illustrated in FIG. 1 is denoted by the same reference numeral. In the embodiment of FIG. 8, a first capacitance array 13A in which k unit elements 11 are connected to a first common output line 12A in parallel and a second capacitance array 13B in which k unit elements 11 are connected to a second common output line 12B in parallel are included as a capacitance array.

As a selector, a first selector 15A to which an analog voltage PIN is input from one of two differential signal lines at the time of sampling and holding and which is connected to the first capacitance array 13A; and a second selector 15B to which an analog voltage NIN is input from the other one of two differential signal lines at the time of sampling and holding and which is connected to the second capacitance array 13B. A comparator 21 compares an output of the first common output line 12A with an output of the second common output line 12B.

The first and second selectors 15A and 15B select the weighted reference voltages VP3 to VP5 supplied to any one of the unit element groups 11A to 11H which are the targets for DEM at the time of successive comparison through the first to third voltage supply lines 14A to 14C, and this is the same as that of the embodiment in FIG. 1.

The first and second selectors 15A and 15B select a common voltage VCM supplied to the first and second common output lines 12A and 12B through a switch SW5 when the unit capacitance of the unit element 11 is reset. In this manner, the common voltage VCM is supplied to both ends of the unit capacitance and then the unit capacitance is reset. In addition, similarly, the common voltage VCM is supplied to both ends of the unit capacitance illustrated in FIG. 1 and the unit capacitance can be reset.

The relationship between the operation states of the first and second selectors 15A and 15B and various switches SW1P, SW1N, SW2P, SW2N, SW3P0/N0, SW3P1/N1, SW4P, SW4N, and SW5 of the successive approximation type AD conversion circuit 2 and the control signal is as illustrated in FIG. 9.

4. Modification Example of Successive Approximation Type AD Conversion Circuit

Figure 10:
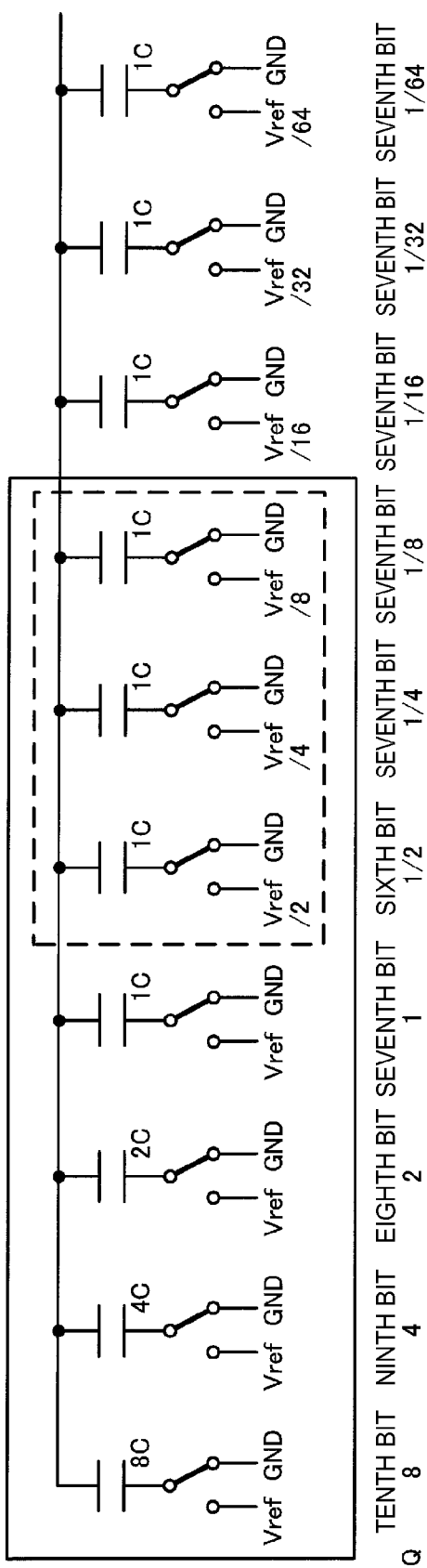
FIG. 10 is a diagram illustrating an example of setting a range in which a reference voltage to be connected to a unit capacitance that does not have a capacitance ratio is weighted in the low order of a DEM application range.
Figure 11:
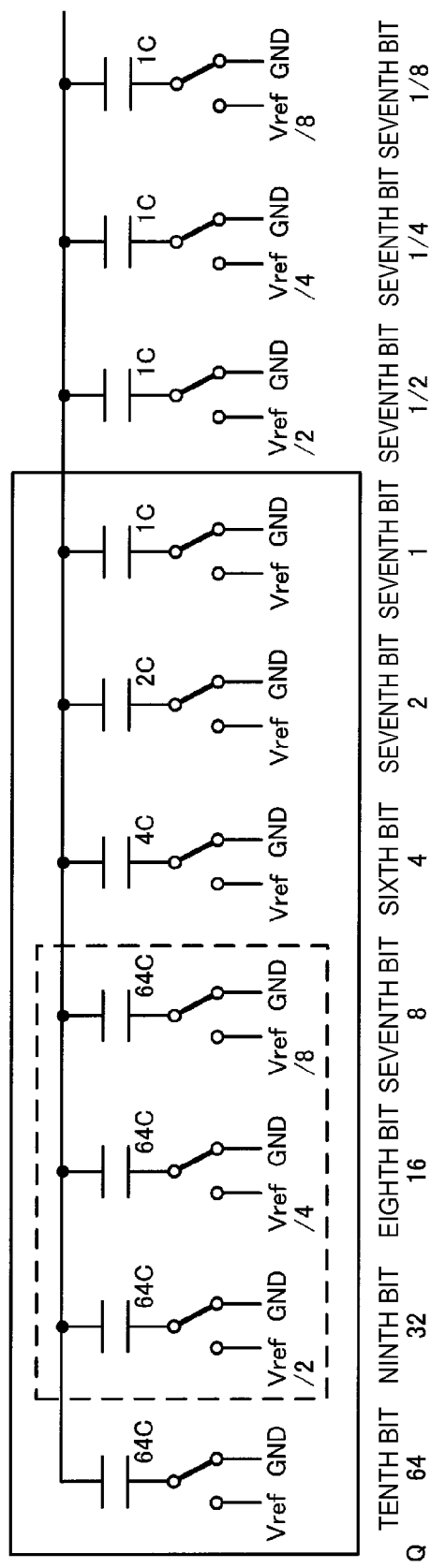
FIG. 11 is a diagram illustrating an example of setting a range in which a reference voltage to be connected to a unit capacitance that does not have a capacitance ratio is weighted in the middle order of a DEM application range.

FIGS. 10 and 11 are equivalent circuit diagrams illustrating a charge redistribution type digital/analog conversion circuit that has a capacitance ratio due to the unit capacitances which are connected in parallel in the same manner as the equivalent circuit illustrated in FIG. 6. As described in the embodiment above, FIG. 10 illustrates an example of providing a range in which a reference voltage connected to a unit capacitance (1C) that does not have a capacitance ratio is weighted (ratio) in the low-order of the DEM application range (frame of a solid line) as indicated by a frame of a dashed line in the DEM application range indicated by the frame of a solid line. Differently from this example, the range may be provided as illustrated in FIG. 11. FIG. 11 illustrates an example of providing a range (frame of a dashed line) in which the reference voltage connected to the unit capacitance (1C) that does not have a capacitance ratio is weighted (ratio) in not the low-order but the middle-order of the DEM application range (frame of a solid line).

5. Physical Quantity Detecting Sensor

Figure 12:
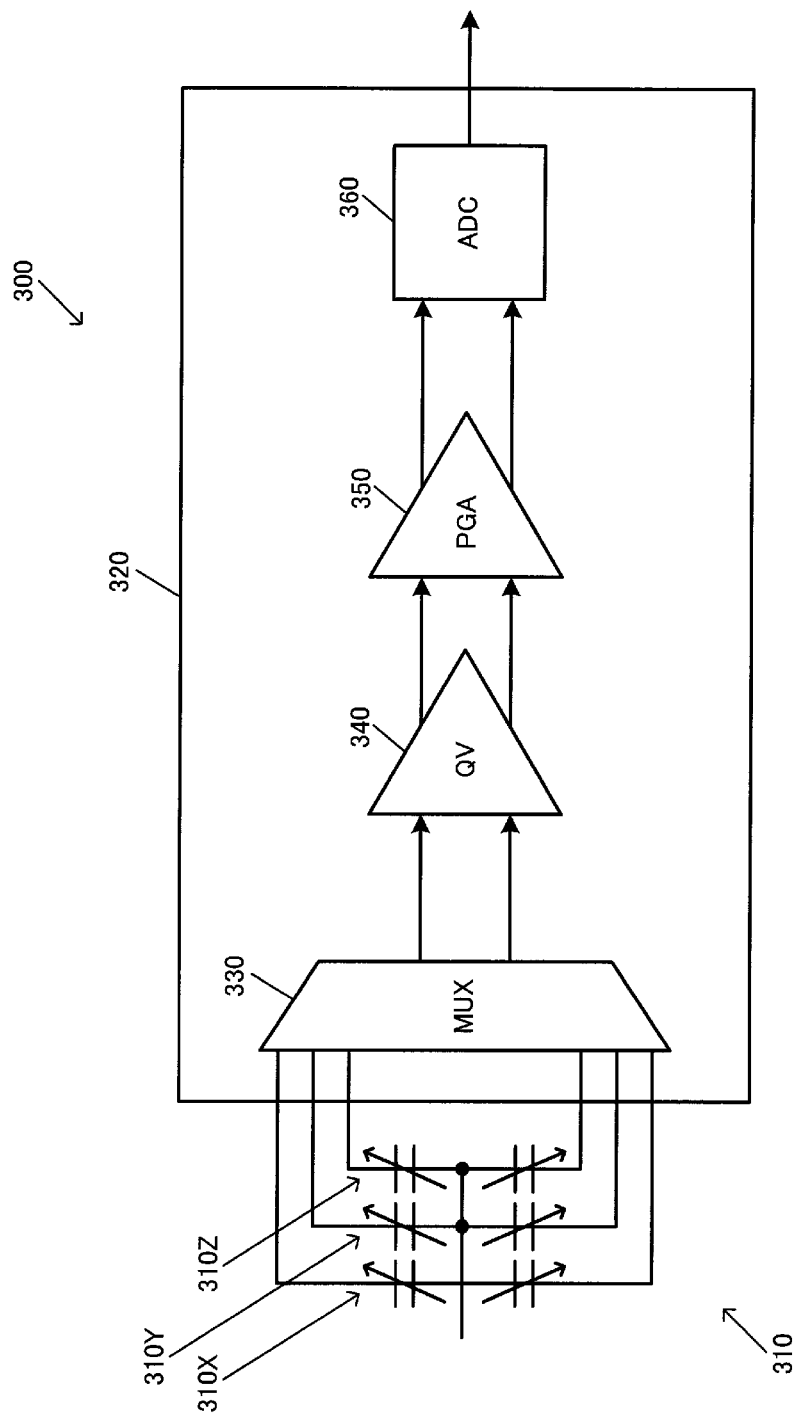
FIG. 12 is a block diagram of a physical quantity detecting sensor capable of using a successive distribution type AD conversion circuit.

FIG. 12 illustrates an acceleration sensor 300 as an example of a physical quantity detecting sensor. The acceleration sensor 300 includes a triaxial acceleration sensor element 310 and an IC 320. The triaxial acceleration sensor element 310 is provided with first to third differential capacitance type acceleration sensor elements 310X, 310Y, and 310Z using an X axis, a Y axis, and a Z axis as respective detection axes.

The charge is input to the IC 320 from the first to third differential capacitance type acceleration sensor elements 310X, 310Y, and 310Z in time division. A multiplexer 330 which is switched and driven is provided for this time division driving.

The rear stage of the multiplexer 330 includes a charge-voltage conversion (QV) amplifier 340 as a capacitance detecting circuit which is an analog circuit; a programmable gain amplifier (PGA) 350; and an analog/digital converter (ADC) 360. The QV amplifier 340 converts the charge from electrostatic capacitance type acceleration sensor elements 310X, 310Y, and 310Z which are input in time division into the voltage. The PGA 350 amplifies an output of the QV amplifier 340 using the gain set for each axis. The ADC 360 performs AD conversion of an output of the PGA 350. As the ADC 360, the successive approximation type AD converters 1 and 2 illustrated in FIGS. 1 and 8 can be suitably used. Particularly, since an output of the triaxial acceleration sensor element 310 illustrated in FIG. 12 is a differential signal, the successive approximation type AD converter 2 illustrated in FIG. 8 can be suitably used.

6. Electronic Device and Moving Object

Figure 13:
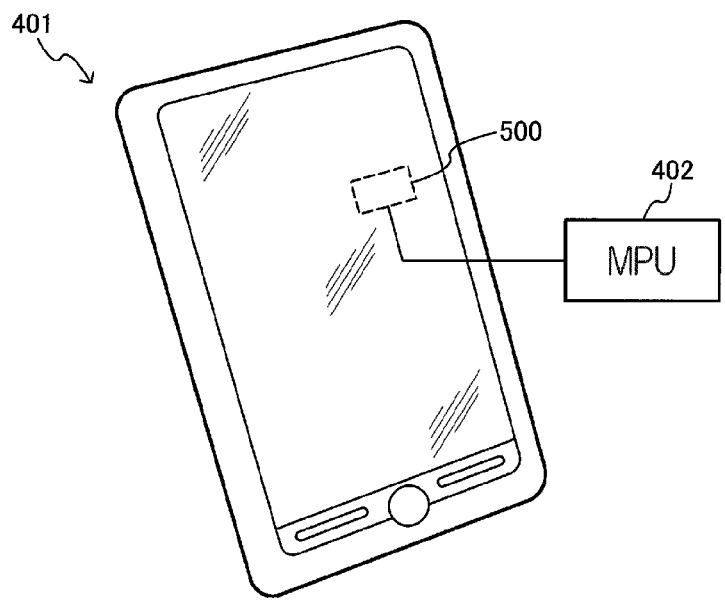
FIG. 13 is a conceptual diagram schematically illustrating a configuration of a smartphone as a specific example of an electronic device.

FIG. 13 schematically illustrates a smartphone 401 as a specific example of an electronic device. The triaxial acceleration sensor 300 illustrated in FIG. 12 and a physical quantity detection device 500 including a triaxial gyro sensor and a detection circuit connected thereto are incorporated in the smartphone 401. The physical quantity detection device 500 can detect the posture of the smartphone 401. So-called motion sensing is performed. A detection signal of the physical quantity detection device 500 can be supplied to, for example, a microcomputer chip (MPU) 402. The MPU 402 can execute various processes according to motion sensing. In addition, such motion sensing can be used for electronic devices such as a mobile phone, a portable game machine, a game controller, a car navigation system, a pointing device, a head mounting display, and a tablet PC. In order to realize the motion sensing, the physical quantity detection device 500 can be incorporated in the smartphone 401.

Figure 14:
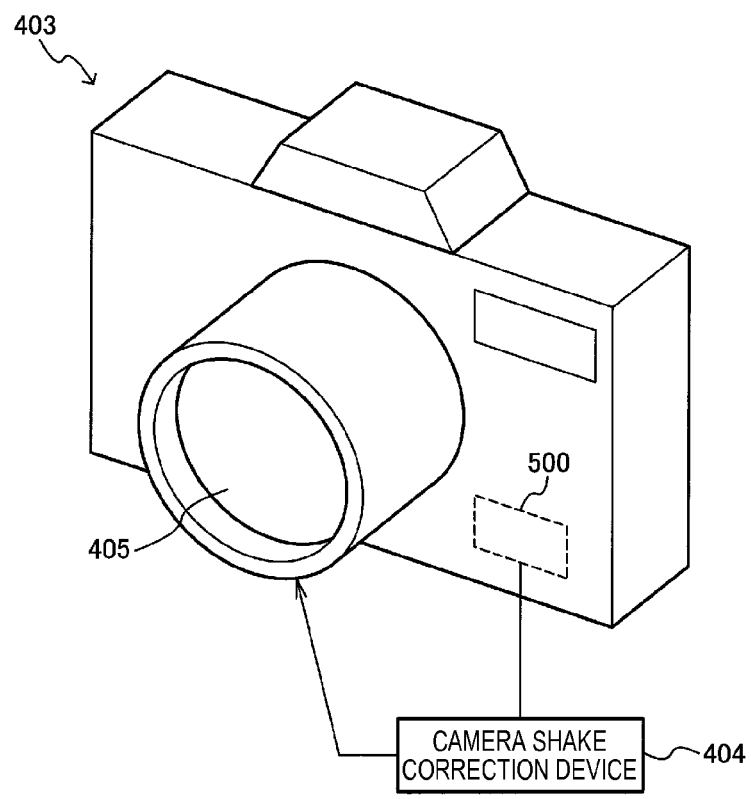
FIG. 14 is a conceptual diagram schematically illustrating a configuration of a digital still camera as another specific example of an electronic device.

FIG. 14 schematically illustrates a digital still camera (hereinafter, referred to as a camera) 403 as a specific example of an electronic device. The physical quantity detection device 500 is incorporated in the camera 403. The physical quantity detection device 500 can detect the posture of the camera 403. The detection signal of the physical quantity detection device 500 can be supplied to a camera shake correction device 404. The camera shake correction device 404 can move a specific lens in, for example, a lens set 405 according to the detection signal of the physical quantity detection device 500. The camera shake can be corrected in this manner. In addition, the camera shake correction can be used in a digital video camera. In order to realize the camera shake correction, the physical quantity detection device 500 can be incorporated in the digital still camera 403.

Figure 15:
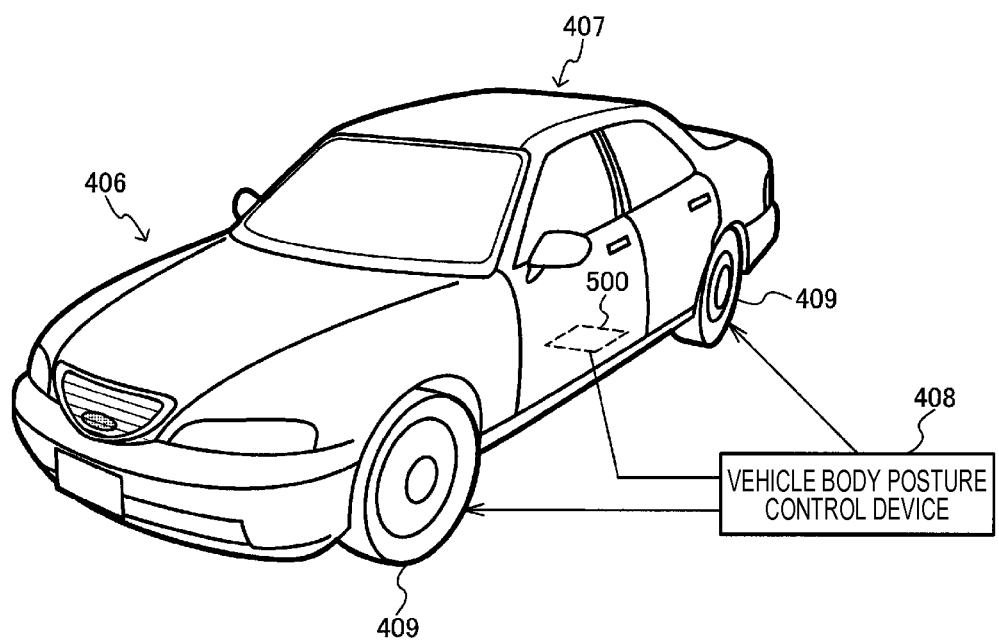
FIG. 15 is a conceptual diagram schematically illustrating a configuration of an automobile as a specific example of a moving object.

FIG. 15 schematically illustrates an automobile 406 as a specific example of a moving object. The physical quantity detection device 500 is incorporated in the automobile 406. The physical quantity detection device 500 can detect the posture of a vehicle body 407. The detection signal of the physical quantity detection device 500 can be supplied to a vehicle body posture control device 408. The vehicle body posture control device 408 can control the hardness of a suspension or brakes of respective wheels 409 according to, for example, the posture of the vehicle body 407. In addition, such posture control can be in various moving objects such as a bipedal walking robot, an aircraft, and a helicopter. In order to realize the posture control, the physical quantity detection device 500 can be incorporated in the automobile 406.

The present embodiment has been described in detail, but the fact that various modifications can be made within the range not substantially departing from the new matters and effects of the invention can be easily understood for a person skilled in the art. Accordingly, such modification examples are all included in the range of the invention. For example, in the specification or the drawings, the terminology described at least once together with different terminology which has broader or the same definitions can be replaced by the different terminology in any parts of the specification or the drawings. In addition, the configurations and the operations of the charge redistribution type DA conversion circuit 10, the resistance voltage-dividing type DA conversion circuit 100, and the like are not limited to those described in the present embodiment and various modifications are possible.

The entire disclosure of Japanese Patent Application No. 2014-062507, filed Mar. 25, 2014 is expressly incorporated by reference herein.

What is claimed is:

1. A successive approximation type AD converter comprising:
   a charge redistribution type DA conversion circuit;
   a comparator that compares an output of the charge redistribution type DA conversion circuit voltage with a reference voltage; and
   a control circuit that controls the charge redistribution type DA conversion circuit based on the comparison results of the comparator,
   wherein the charge redistribution type DA conversion circuit includes:
      a unit capacitor array in which respective k (k is an integer of 4 or greater) unit elements are configured by connecting a switch and a unit capacitance in series and the k unit elements connected to a common output line in parallel are two-dimensionally arranged; and
      a selector that selects one voltage supplied to one input terminal, through m (m is an integer of 2 to smaller than j) voltage supply lines, among at least three input terminals of the switch having j (j is an integer of 4 to k) unit elements that are the targets for dynamic element matching (DEM) in the k unit elements based on the DEM,
   the control circuit controls the selector and respective switches of the k unit elements based on the comparison results of the comparator,
   the selector selects an analog voltage to be converted which is to be supplied to the m voltage supply lines in common during a first period for which an analog voltage is sampled and held in the unit capacitor array, and
   the selector selects m weighted reference voltage as a voltage to be supplied to the m voltage supply lines during the second period for which the comparison is successively performed subsequent to the first period.

2. The successive approximation type AD converter according to claim 1, wherein the weighted reference voltage is generated by resistance-voltage dividing a reference voltage using a resistance voltage-dividing type DA converter.

3. The successive approximation type AD converter according to claim 1, wherein the control circuit switches the switch such that one input terminal is electrically conducted with the unit capacitance during the first period, and the control circuit switches the switch such that either of one of m weighted reference voltages and a ground voltage is supplied to the m unit elements and switches the switch such that one of the reference voltage and the ground voltage to be supplied to other input terminals other than the one input terminal of the switch is supplied to the remaining (j−m) unit elements.

4. The successive approximation type AD converter according to claim 3, wherein the j unit elements are arranged in M rows×N columns (N is an integer of two or greater and M is an integer of m or greater), one of the m voltage supply lines, a supply line of the reference voltage, and a supply line of the ground voltage are extended for each of M rows along a row direction in the matrix of M rows×N columns, and at least one control signal line that specifies the m unit elements and m control signal lines that select one input terminal from among at least three input terminals are extended from each of N columns along a column direction in the matrix of M rows×N columns.

5. The successive approximation type AD converter according to claim 4, wherein N is greater than M.

6. The successive approximation type AD converter according to claim 5, wherein M is equal to m.

7. The successive approximation type AD converter according to claim 4, wherein j is smaller than k and (k−j) unit elements that are not the targets for DEM are arranged adjacently to an endmost column in the matrix of M rows×N columns, and one of the m weighted reference voltages is input to one input terminal of the switches respectively included in the (k−j) unit elements and the ground voltage is input to another input terminal thereof.

8. The successive approximation type AD converter according to claim 1, further comprising a reset switch that supplies a common voltage to the common output line, wherein the selector selects the common voltage at the time of resetting the unit capacitance and the common voltage is supplied to both ends of the unit capacitance.

9. The successive approximation type AD converter according to claim 1, wherein the unit capacitor array includes a first capacitance array in which the k unit elements are connected to a first common output line in series and a second capacitance array in which the k unit elements are connected to a second common output line in parallel, and the selector includes a first selector to which the analog voltage is input from one of two differential signal lines and which is connected to the first capacitance array and a second selector to which the analog voltage is input from the other differential signal line and which is connected to the second capacitance array, and the comparator compares an output from the first common output line with an output from the second common output line.

10. A physical quantity detecting sensor comprising:
a physical quantity detecting sensor element; and
an IC that is connected with the physical quantity detecting sensor element and includes the successive approximation type AD converter according to claim 1.

11. A physical quantity detecting sensor comprising:
a physical quantity detecting sensor element; and
an IC that is connected with the physical quantity detecting sensor element and includes the successive approximation type AD converter according to claim 2.

12. A physical quantity detecting sensor comprising:
a physical quantity detecting sensor element; and
an IC that is connected with the physical quantity detecting sensor element and includes the successive approximation type AD converter according to claim 3.

13. A physical quantity detecting sensor comprising:
a physical quantity detecting sensor element; and
an IC that is connected with the physical quantity detecting sensor element and includes the successive approximation type AD converter according to claim 4.

14. A physical quantity detecting sensor comprising:
a physical quantity detecting sensor element; and
an IC that is connected with the physical quantity detecting sensor element and includes the successive approximation type AD converter according to claim 5.

15. An electronic device comprising the physical quantity detecting sensor according to claim 10.

16. A moving object comprising the physical quantity detecting sensor according to claim 10.

17. A successive approximation type AD conversion method comprising:

specifying m (m is an integer of 2 to smaller than j) unit elements, by dynamic element matching (DEM), among j (j is an integer of 4 to k) unit elements that are the targets for the DEM from among k (k is an integer of 4 or greater) unit elements which are provided in a charge redistribution type DA conversion circuit and respectively configured by connecting a switch and a unit capacitance in series, supplying a weighted reference voltage to the m unit elements through one input terminal among at least three input terminals of the switches respectively provided for the m unit elements, and supplying one of the reference voltage and a ground voltage supplied to other input terminals other than the one input terminal to the (j−m) unit elements through the switch included in the remaining (j−m) unit elements.

18. The successive approximation type AD conversion method according to claim 17, wherein the weighted reference voltage is generated by resistance voltage-dividing the reference voltage in a resistance voltage-dividing DA conversion circuit.

19. The successive approximation type AD conversion method according to claim 17, wherein the m unit elements are specified from among the j unit elements arranged in M rows×N columns (N is an integer of 2 or greater and M is an integer of m) in a column unit by the DEM.

20. The successive approximation type AD conversion method according to claim 19, wherein a pointer is set to one of the j unit elements arranged in M rows×N columns, and the m unit elements are specified in a column unit by the DEM based on the position of the pointer.

* * * * *